United States Patent [19]

Walker et al.

[11] Patent Number: 4,601,031

[45] Date of Patent: Jul. 15, 1986

[54] REPAIRABLE ROM ARRAY

[75] Inventors: Christopher P. H. Walker, Bristol, England; Peter J. Wilson, Colorado Springs, Colo.

[73] Assignee: Inmos Limited, Bristol, England

[21] Appl. No.: 545,082

[22] Filed: Oct. 24, 1983

[30] Foreign Application Priority Data

Oct. 29, 1982 [GB] United Kingdom ............... 8231055

[51] Int. Cl.⁴ .................................................. G06F 11/22
[52] U.S. Cl. ......................................... 371/10; 371/21; 371/30
[58] Field of Search ....................................... 371/7-8, 371/10, 15, 21, 30, 48-49, 53, 38-40; 324/73 R, 73 AT; 365/201, 200, 94-96

[56] References Cited

U.S. PATENT DOCUMENTS

| | | | |
|---|---|---|---|
| 3,222,653 | 12/1965 | Rice | 371/10 X |
| 3,633,175 | 1/1972 | Harper | 371/10 X |
| 3,755,791 | 8/1973 | Arzubi | 371/10 X |
| 3,898,443 | 8/1975 | Smith | 371/10 X |
| 4,047,163 | 9/1977 | Choate et al. | 371/10 X |
| 4,150,428 | 4/1979 | Inrig et al. | 371/10 X |
| 4,254,477 | 3/1981 | Hsia et al. | 371/10 X |
| 4,346,459 | 8/1982 | Sud et al. | 365/200 |
| 4,376,300 | 3/1983 | Tsang | 371/10 X |
| 4,389,715 | 6/1983 | Eaton et al. | 365/200 |
| 4,450,559 | 5/1984 | Bond et al. | 371/10 |
| 4,456,995 | 6/1984 | Ryan | 371/21 |
| 4,459,685 | 7/1984 | Sud et al. | 365/200 |
| 4,460,999 | 7/1984 | Schmidt | 371/21 |

FOREIGN PATENT DOCUMENTS

| | | |
|---|---|---|
| 1311997 | 3/1973 | United Kingdom . |
| 1346219 | 2/1974 | United Kingdom . |
| 1398438 | 6/1975 | United Kingdom . |
| 1455716 | 11/1976 | United Kingdom . |
| 1488271 | 10/1977 | United Kingdom . |
| 1528100 | 10/1978 | United Kingdom . |
| 1531528 | 11/1978 | United Kingdom . |
| 1550675 | 8/1979 | United Kingdom . |

OTHER PUBLICATIONS

Bechtle et al., "On-Chip Redundancy Scheme", *IBM Technical Disclosure Bulletin*, vol. 22, No. 10, Mar. 1980, pp. 4608–4609.

Sakalay, "Correction of Bad Bits in a Memory Matrix", *IBM Technical Disclosure Bulletin*, vol. 6, No. 10, Mar. 1980, pp. 1-2.

*Primary Examiner*—Gary V. Harkcom
*Attorney, Agent, or Firm*—Edward D. Manzo

[57] ABSTRACT

The individual rows of a ROM array are accessed by a row decoder/driver in response to the arrival of the address of the individual row on the address lines. A plurality of programmable switches store the address of a row of ROM array found to contain one or more defects. If the incoming address is that of the defective row each of a plurality of comparators connected to both an address line and the associated switch outputs a coincidence signal to an AND gate. The output of the AND gate accesses a spare row of RAM which thus replaces the defective row of the ROM array. Access to the spare row is automatic upon receipt of the address of the defective row. Each column of the ROM array contains a check bit computed from the remaining contents of the respective column, and the data to be stored in the spare row is generated from the remaining contents of the ROM array. At initialization, the generated data which should have been stored in the defective row is written into the spare row.

25 Claims, 5 Drawing Figures

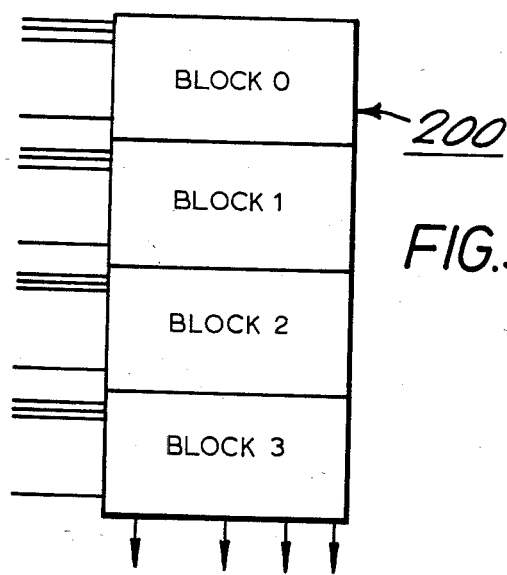
FIG.3.
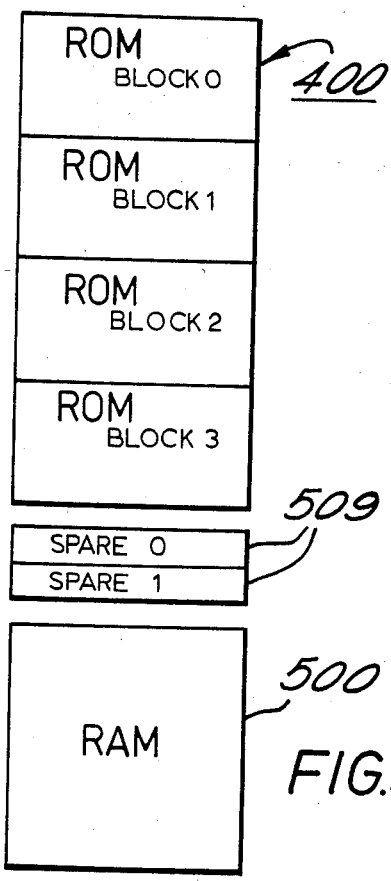
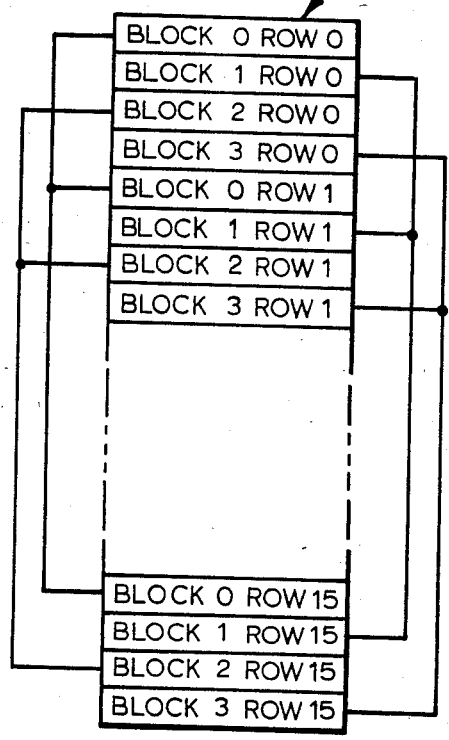
FIG.4.
FIG.5.

4,601,031

REPAIRABLE ROM ARRAY

BACKGROUND TO THE INVENTION

The present invention relates to a method of repairing a ROM array and to a memory circuit.

The memory pattern programmed into a read-only memory (ROM) cannot be changed and therefore it is essential that the program to be stored in it is correct and free from errors. Of course, both manufacturing and programming defects do arise during the fabrication of such memories.

The yield of the fabrication process can be improved if ROM'S including defects can be repaired. However, this is only economic if the ROM can be made to be repairable simply and without complex circuitry.

In connection with random access memories, it has been proposed to provide spare memory capacity which can be used in place of defective locations in the memory. See, for example, British Pat. No. 1455716
British Pat. No. 1398438
British Pat. No. 1311997
British Pat. No. 1550675

Attempts have also been made to provide redundancy for ROM arrays, as evidenced by:

British Pat. No. 1528100
British Pat. No. 1488279
British Pat. No. 1531528
British Pat. No. 1346219 but, in general, these proposals involve complex and therefore expensive circuits.

None of these specifications concerns itself with the problem as to how the data, which will be erroneously represented in the defective locations of the ROM, can be easily determined so that it can be stored in the spare memory capacity.

SUMMARY OF THE INVENTION

According to the present invention there is provided a method of repairing a ROM array having a row which has been found to contain one or more defects, comprising the steps of storing the address of the defective row, storing the data which should have been stored by the defective row in a spare row of programmable memory, and causing said spare row to accessed whenever said defective row is addressed such that said defective row is replaced by said spare row, wherein each column of the ROM array contains a check bit computed from the remaining contents of the respective column, and the data stored in the spare row is generated from the remaining contents of the ROM array.

As the spare row is accessed whenever the defective row is addressed there is no need to identify the address of the defective row in any program to be executed. In addition, the data to be stored in the spare row can be generated by a simple procedure from the remaining contents of the ROM array.

In an embodiment, data is stored in said spare row by the steps of generating the data to be stored from the remaining contents of the ROM array, sequentially addressing each row of the ROM array, and enabling writing means such that when said defective row is addressed said spare row of programmable memory is accessed and said writing means writes said data into said spare row.

Preferably, each check bit represents the number of logical "zeros" or "ones" in the respective column, and the data to be stored in the spare row is generated by writing a known value in each bit of the spare row, and computing a further check bit for each column representative of the number of logical "zeros" or "ones" in the respective column of the ROM array and of the spare memory row.

The present invention also extends to a memory circuit comprising a ROM array, each column of the ROM array containing a check bit computed from the remaining contents of the respective column, means for accessing individual rows in the ROM array in response to the receipt of the address of the individual row, and apparatus for repairing the ROM array by replacing a row which has been found to have one or more defects, said apparatus comprising means for storing the address of the defective row, a spare row of programmable memory for storing the data which should have been stored in the defective row, and means causing said spare row to be accessed whenever said defective row is addressed whereby said defective row is replaced by said spare row, wherein the data in the spare row is generated from the remaining contents of the ROM array.

In an embodiment, said apparatus further comprises writing means arranged when enabled to write data into said spare memory row.

Preferably, said circuit further comprises means for feeding the data in an accessed row of the ROM array to an output, said apparatus including means causing the data in said spare memory row to be fed to said output whenever said defective row is addressed.

In one embodiment, said means for accessing individual rows in the ROM array includes a row decoder/driver connected to access the individual rows and connected to a plurality of address lines, wherein said comparing means comprises a plurality of comparators, one input of each comparator being connected to a respective address line, and further comprising a plurality of programmable switches for storing the address of the defective row, one programmable switch being associated with each address line being connected to the second input of the respective comparator, and an AND gate connected to the output of each comparator to provide the spare select signal when both inputs to each comparator coincide.

In order to enable more than one defective row in a ROM array to be replaced, a plurality of spare memory rows may be provided. In an embodiment, said ROM array includes a number of blocks of ROM and each of said spare rows is associated with one of said blocks such that one defective row in each block is replaceable by the associated spare row, the associated spare row being accessed whenever the defective row in that block is addressed.

BRIEF DESCRIPTION OF THE DRAWINGS

Embodiments of the present invention will hereinafter be described, by way of example, with reference to the accompanying drawings, in which:

FIG. 3 shows schematically a ROM array formed of several blocks of ROM,

FIG. 4 shows schematically a ROM array formed of several blocks of ROM but with the rows of different blocks interleaved, and FIG. 5 shows schematically a ROM array formed of several blocks of ROM, a RAM array and spare memory rows.

DESCRIPTION OF THE PREFERRED EMBODIMENTS

Figure 1:
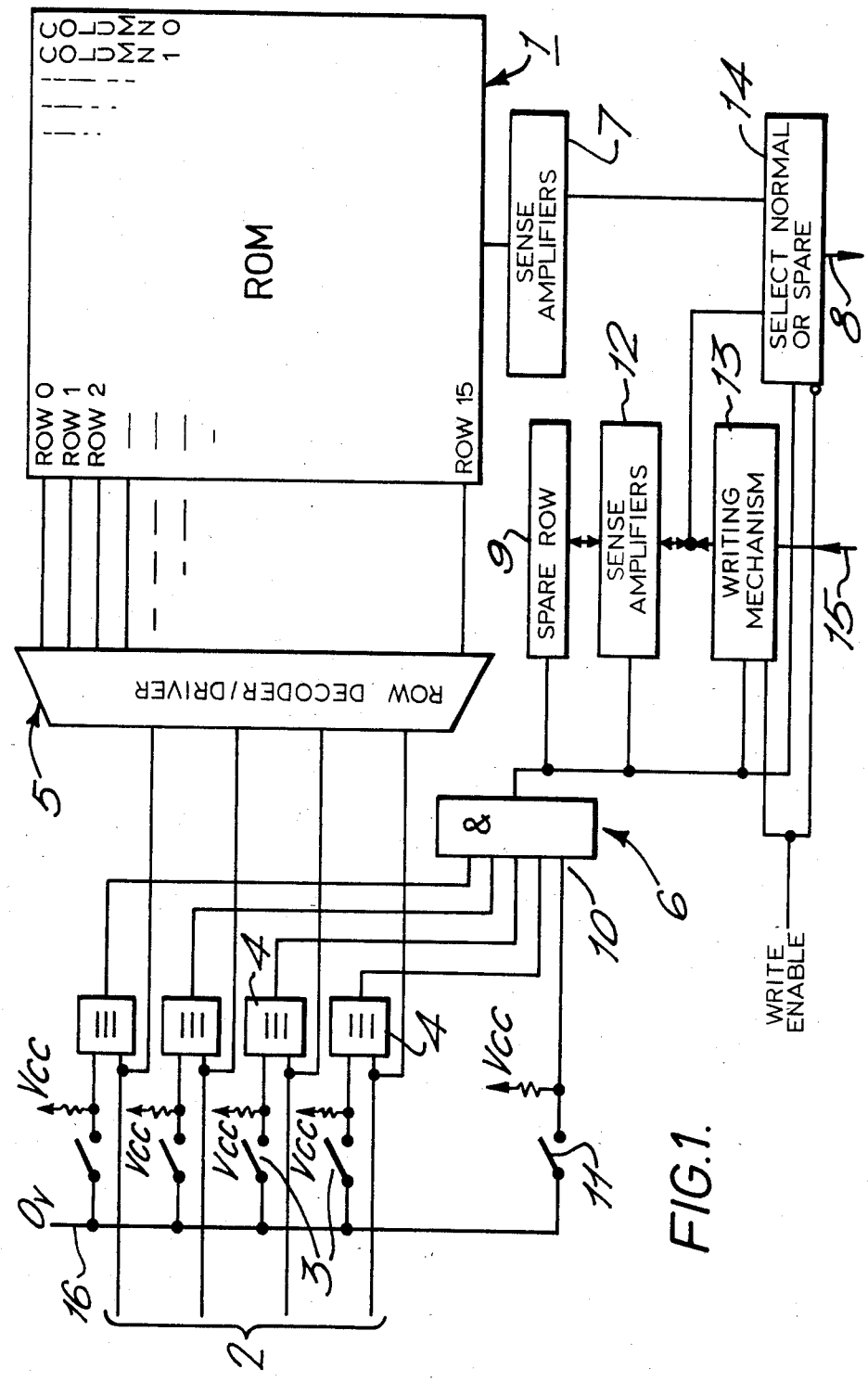
FIG. 1 shows an embodiment of a memory circuit enabling a ROM array to be repaired.

FIG. 1 shows a block diagram of a memory circuit including a read-only memory (ROM) and enabling the ROM to be repaired. In this embodiment, the ROM is an array 1 having 16 rows and 16 columns, and it is assumed that each word will be 16 bits such that a single word can be stored in each row of the ROM array 1.

The circuit illustrated in FIG. 1 includes address lines 2, and input and output data lines 15 and 8. It is intended that the memory circuit of FIG. 1 would be used with a processor or other control unit (not shown) which would address the ROM array 1 and make use of the data output at the output line 8 in normal manner in accordance with its program.

Each row of the ROM array 1 is connected to a row decoder/driver 5 which is arranged to access an individual row of the ROM array 1 upon receipt of the appropriate 4 bit row address on the four address lines 2. The bits in the accessed row are sensed by sense amplifiers 7 and the word read is output on the output data line 8.

As described so far the circuit and its operation are conventional enabling the contents of the ROM array to be read. Accordingly, the components and their manner of operation will be apparent to those skilled in the art and will not be further described.

Once a ROM is programmed the information stored therein cannot be subsequently changed. The programmed ROM is tested to determine if it contains the information required, and frequently defects and faults will be detected.

The circuitry shown in FIG. 1 includes a spare memory row 9 which can be used in place of a defective row in the ROM array 1. This spare memory row 9 could be of programmable read-only memory (PROM), of laser links, or of erasable programmable read-only memory (EPROM). In one embodiment the spare memory row 9 is of random access memory (RAM). The spare memory row 9 may be a single row of memory as shown. Alternatively, it may be one row of a RAM array. In a preferred embodiment it is envisaged that, where both a ROM array and a RAM array are provided in the same circuit, a number of rows of the RAM will be set aside to provide spare rows for replacing defective rows in both the ROM and RAM arrays as required.

The circuitry of FIG. 1 includes four programmable switches 3 which, if the test of the ROM array identifies a defective row of ROM, are programmed to store the address of the defective row. Preferably, each of the switches 3 is a fuse which can be blown or not blown during testing such that the address of the defective row is frozen into the switches 3. Each switch 3 is connected to one input of a respective comparator 4 and the other input of each comparator 4 is connected to a respective address line 2. The outputs of all the comparators are fed to an AND gate 6.

The AND gate 6 has a fifth input 10 which is connected to further programmable switch 11 which again is preferably a fuse. The switch 11 is open (blown) if the test on the ROM array identifies a defective row to be placed, but remains closed (not blown) if there is no defective row in the ROM array such that access to the spare memory row 9 is not required.

The output of the AND gate 6 is connected to the spare memory row 9, to sense amplifiers 12 for sensing the contents of the spare row 9 and to a writing mechanism 13 for the spare memory row 9. The output of the AND gate 6 is also connected to a select circuit 14, one input of which is connected to the sense amplifiers 12 and the other input of which is connected to the sense amplifiers 7. The output of the select circuit 14 is the data output line 8.

Consider the case where the ROM array 1 has been tested and a single row thereof has been identified to contain one or more defects. The address of the defective row is programmed into the switches 3. Thus, if the switches 3 are fuses a high current will be passed through selected ones of the fuses to blow them such that they each present a logical 'one' to their respective comparator whilst the other fuses will be left unblown such that they present a logical 'zero' to their respective comparators. In this respect it will be appreciated from FIG. 1 that one terminal of each switch 3 and 11 is connected by a line 16 to 0v (Vss) of the supply whereas the other terminal of each switch 3 and 11 is connected to the supply voltage Vcc. Furthermore, for the purpose of this discussion, a high voltage level signal represents a logical "one" whilst a low level signal represents a logical "zero".

As the ROM array 1 has a defective row, the fuse 11 will also have been blown such that it represents a logical 'one' which is input to the AND gate 6.

As indicated above, the fuses which are to be blown are blown by passing a high current therethrough. A programmable memory tester (not shown) may be used for this purpose, such a tester comparing the contents of the ROM with the required contents and being arranged to program the switches 3 with the address of any defective row identified by causing a high current to be fed to each fuse to be blown to render it substantially open circuit.

As the structure and operation of the memory tester are not part of the present invention they are not further described therein. However, it is noted that the circuit for programming the switches 3 and 11 may be part of the memory tester such that the switches 3 and 11 are programmed during memory test by the manufacturer. Alternatively, the circuit for programming the switches 3 and 11 may be provided in circuit with the ROM array and associated circuitry such that the switches can be programmed by the user. In this latter case it is envisaged that the switches need not be fuses but could be locations in a RAM array and that the user would program the switches during initialisation.

Not only must the address of the defective row of the ROM array 1 be stored, but also the correct data which should have been fixed in that row of the ROM must be written into the spare memory row 9. A simple procedure for generating the correct data is outlined in greater detail below.

Once the address of the defective row of the ROM has been stored in the programmable switches 3, and the data which should have been in that row has been written into the spare memory row 9, the ROM array 1 can be used normally. Thus, if the address of any row of the ROM array 1, except that of the defective row, appears on the address lines 2, the row decoder/driver 5 will access that row in the ROM array 1 and the sense amplifiers 7 will sense the bits in that row. Because the address on lines 2 is not identical to that stored by the switches 3, some of the comparators 4 will have the output "zero" indicating different inputs whilst others of the comparators 4 will have the output "One" indicating identical inputs. Accordingly, not all of the inputs to the AND gate 6 will be identical and the output of the gate 6 will be "Zero". This 'Zero' signal is arranged to cause the select circuit 14 to output the data sensed by the sense amplifiers 7 to data output line 8 such that the data at the output line 8 is the word stored in the addressed row of the ROM array 1.

If the address of the defective row of the ROM appears on the address lines 2, the decoder/driver 5 will still access that row in the ROM array and the sense amplifiers 7 will sense the bits in the defective row. However, the address on the lines 2 is identical to that stored by the switches 3 such that the output of each comparator 4 will be a 'One' indicating coincidence of its inputs. Each of the inputs to the AND gate 6 will be a "One" such that the output of the gate 6 will be "One". This "One" signal from the gate 6 will access the spare memory row 9 and the data therein will be sensed by the sense amplifiers 12. Furthermore, this "One" signal is arranged to cause the select circuit 14 to output the data sensed by the sense amplifiers 12 associated with the spare row such that the data at the output line 8 is the word stored in the spare memory row 9.

The procedure by which the data to be written into the spare memory row 9 is determined is discussed below. The data is actually written into the row 9 by way of writing mechanism 13 in substantially conventional manner. Thus, the row 9 is accessed by addressing the lines 2 with the address of the defective row of ROM such that the output of gate 6 is "One" and the row 9 is accessed. The 'One' is also arranged to enable the writing mechanism 13 such that it writes any input data appearing on the input line 15 into the row 9.

It will be appreciated that it is not necessary to identify the address of the defective row of ROM in any program being excecuted because addressing of the defective row will automatically access the spare memory row 9. Thus, data will be written into the spare memory row 9 by providing the data on the input line 15 and accessing each row of the ROM array 1 sequentially. When the defective row is addressed the spare memory row 9 will automatically be accessed and the writing mechanism 13 enabled.

In the description given above of the operation of the circuitry of FIG. 1 it has been assumed that during testing of the ROM array 1 a defective row was found and its address programmed into the switches 3. At the same time the switch 11 will have been programmed to represent "One" and thus the existence of a defective row. However, if the test shows that there is no defective row in the ROM the switch 11 will be programmed accordingly to represent a logical "Zero" which is fed to the gate 6. For example, if the switch 11 is a fuse this will remain closed (not blown) such that a low level signal appears on the line. As one input to the AND gate 6 will always be "Zero" its output will be "Zero" and the select circuit 14 will always take the output from the sense amplifiers 7 associated with the ROM array 1 and the spare row 9 and its associated circuitry will not be accessed.

In the embodiment illustrated, the single spare memory row 9 has its associated sense amplifiers 12, and writing mechanism 13. However, if the row 9 is in fact a row in a RAM array, the sense amplifiers and writing mechanism normally associated with the array could be used in place of those illustrated.

In most circumstances the spare memory row 9 will be of RAM, and thus, although the manufacturer can freeze the address of the defective ROM row into the switches 3, the user will need to write the correct data into the spare row 9 as part of the initialization process whenever the power supply has been removed from and is restored to the circuitry. It is preferred that the ROM array should be programmed to include check bits such that the data to be written into the spare memory row 9 can be easily determined. Thus, each column of the ROM array contains a check bit computed from the remaining contents of the column and representative of the number of logical "Zeros" or "Ones" in that column. It is preferred that the check bits be arranged in check words and that this is stored in a row of the ROM array set aside for this purpose and associated with each group of rows of the array. For example, the ROM array 1 of FIG. 1 has 16 rows and it would be envisaged that of these 15 rows would store data and the sixteenth row would store the check word. Preferably, the check word is computed such that each column individually adds up to either 'One' or 'zero'.

It is preferred that each column has an even number of "ones", that is, that it has even parity and in fact will add to "Zero".

For simplicity, we will only consider the data content of a 4×4 ROM array in the following, but it will be apparent that the procedures described are applicable to the entry in the spare memory row 9 of the correct data. Thus, for example, consider that a 4×4 ROM array contains the following data:

| 0 | 1 | 0 | 0 | row 0 |
| 1 | 1 | 1 | 1 | row 1 |
| 1 | 0 | 1 | 0 | row 2 |

A check word is computed for storage in row 3 such that each column will then have even parity. This check word will be 0001 and when it is programmed into the ROM array this will contain:

| 0 | 1 | 0 | 0 | row 0 |
| 1 | 1 | 1 | 1 | row 1 |
| 1 | 0 | 1 | 0 | row 2 |
| 0 | 0 | 0 | 1 | row 3 (check word) |

During the manufacturing test, the manufacturer compares the actual contents of the ROM array with the data he had determined to include. Suppose that the data should have been that shown above but that row 2 is found to be faulty. The address of row 2 is programmed into the switches 3 as described above.

When the ROM array is to be used, an initialization process is required and the writing mechanism 13 is enabled to write "Zeros" into the spare memory row 9. As addressing the defective row of the ROM array automatically accesses the spare row 9, the initialization program could sequentially access each ROM row and try to write "Zeros" in each location of each row. Only the spare row 9 would, of course, be set to zero.

The contents of the ROM array would then be:

| 0 | 1 | 0 | 0 | row 0 |

-continued

| | | | | |
|---|---|---|---|---|
| 1 | 1 | 1 | 1 | row 1 |
| 0 | 0 | 0 | 0 | spare row |
| 0 | 0 | 0 | 1 | row 3 (check word) |

A parity word is then computed which will make each column have even parity.
Thus,

| | | | | |
|---|---|---|---|---|
| 0 | 1 | 0 | 0 | row 0 |
| 1 | 1 | 1 | 1 | row 1 |
| 0 | 0 | 0 | 0 | spare row |
| 0 | 0 | 0 | 1 | row 3 |
| 1 | 0 | 1 | 0 | parity word |

The rows of the ROM are then sequentially accessed and the parity word is input to the writing mechanism. Of course, the parity word will only be written into the spare row, and the contents of the ROM array will then be:

| | | | | |
|---|---|---|---|---|
| 0 | 1 | 0 | 0 | row 0 |
| 1 | 1 | 1 | 1 | row 1 |
| 1 | 0 | 1 | 0 | spare row |
| 0 | 0 | 0 | 1 | row 3. | which is the data originally required.

Thus, if the check word is to be computed such that each column has even parity, the spare row is set to zero, and then a parity word having even parity is computed.

The computed parity word will be the data which should have been stored in the defective row.

Alternatively, the check word provided can be computed such that each column has odd parity, that is, that each column adds to 'One' and has an odd number of "Ones". The defective row is still set to zero but the parity word is also computed to have odd parity.

Of course, the check words may be chosen as required but it may then be necessary to perform more complex calculations to determine the data which should be stored in the defective row. It is preferred that the check words be computed such that the columns have parity as the generation of the required data for the spare memory row 9 is thereby rendered simple.

The embodiment illustrated in FIG. 1 includes a ROM array 1 having 16 rows and 16 columns such that a single word is stored in each row of the array. However, the invention is equally applicable to ROM arrays in which more than one word is stored in each ROM row.

Figure 2:
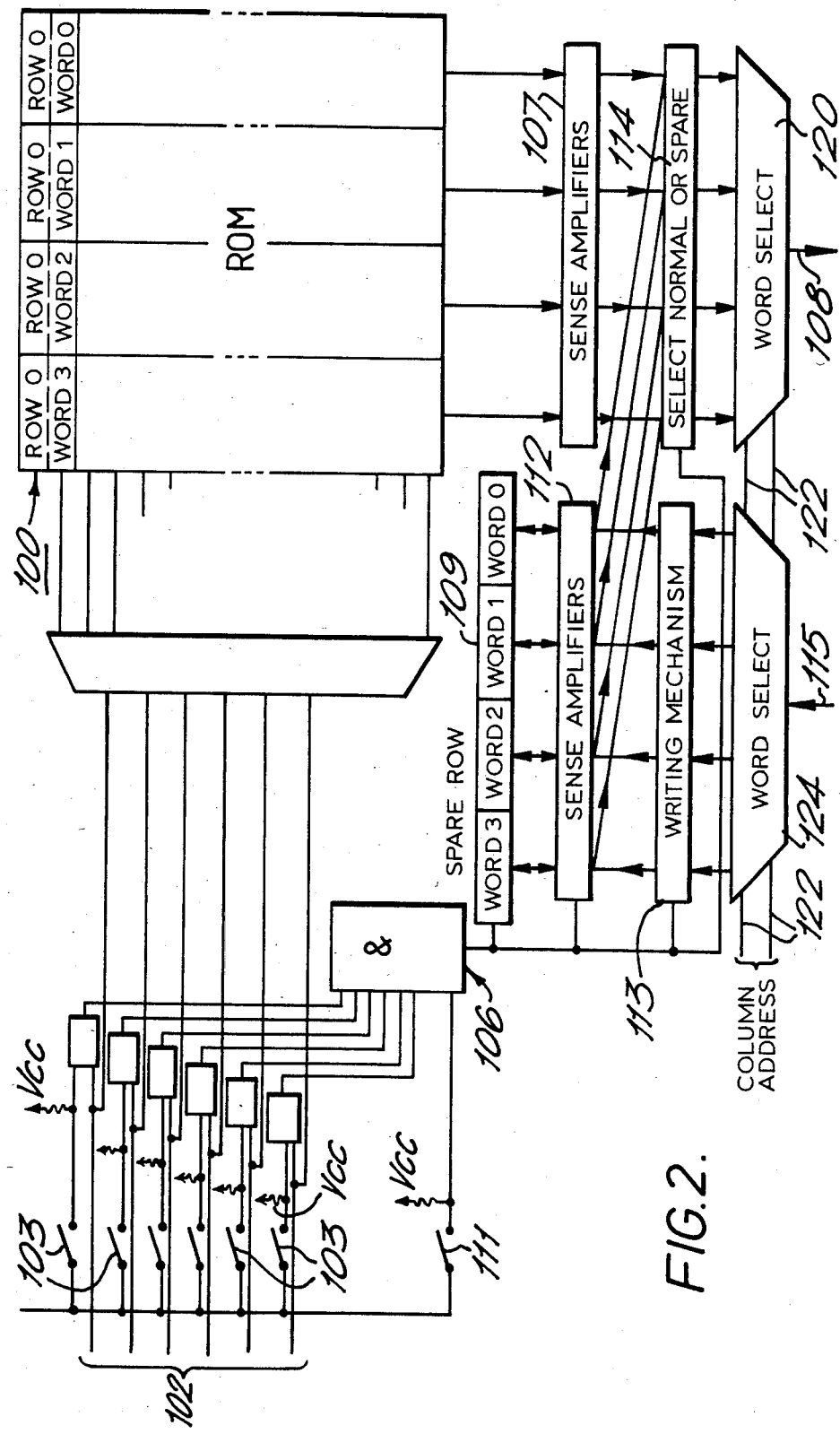
FIG. 2 shows a memory circuit similar to that of FIG. 1 enabling the repair of a ROM array in which a plurality of words are stored in each row.

FIG. 2 shows the circuitry associated with a ROM array 100 which has 64 rows and 64 columns. As is indicated, the word length is 16 bits such that each row of the ROM array 100 stores four complete words. In known manner, sense amplifiers 107 are provided to sense all the words in an accessed row and a known word select circuit 120 is provided to select one of the four words read and output it to output data line 108. In this respect, the word select circuit 120 is controlled by the column address received on column address lines 122 to which it is connected.

As previously, programmable switches 103 are provided to store the address of the defective row and an AND gate 106 enables access to a spare memory row 109 when the address of the defective ROM row appears on address lines 102. Of course, there are six address lines 102 and six switches 103 because it requires 6 bits to give each of 64 rows a distinct address. A further programmable switch 111 is also provided to prevent access to the spare memory row 109 if there is not a defective row in the ROM array 100.

As indicated, the spare memory row 109 has 64 bits so that it is able to store the same information as one row of the ROM array 100. Sense amplifiers 112 are provided to sense the stored words and a select circuit 114 enabled by the gate 106 selects whether the output of the sense amplifiers 112 or of the same amplifiers 107 is fed to the word select circuit 120. A writing mechanism 113 is connected to a word select circuit 124 which is connected to a data input line 115 and controlled by the column address lines 122. The writing mechanism 113 is enabled by the gate 106.

The operation of the circuit of FIG. 2 is substantially the same as described above in connection with FIG. 1 and accordingly will not be described further herein.

The data to be written into the spare memory row 109 is generated by the simple procedure using check words and computing parity words described above. In this respect it should be noted that where more than one word is stored in each row, this procedure does not require that all the check words be provided in one row. Consider the following example in which 4 bit words are stored in 8 bit rows, and suppose that the ROM is to contain the following data:

| | | | | | | | | |
|---|---|---|---|---|---|---|---|---|
| 0 | 1 | 0 | 0 | 0 | 1 | 1 | 0 | row 0 |
| 1 | 1 | 1 | 1 | | unused | | | row 1 |
| 1 | 0 | 1 | 0 | 1 | 1 | 0 | 0 | row 2 |
| | unused | | | 0 | 0 | 1 | 0 | row 3 |

Using even parity, check words are computed for each column of words and included in the unused locations such that the ROM should now contain:

| | | | | | | | | |
|---|---|---|---|---|---|---|---|---|
| 0 | 1 | 0 | 0 | 0 | 1 | 1 | 0 | row 0 |
| 1 | 1 | 1 | 1 | ⎣1 | 0 | 0 | 0⎦ | row 1 |
| 1 | 0 | 1 | 0 | 1 | 1 | 0 | 0 | row 2 |
| ⎣0 | 0 | 0 | 1⎦ | 0 | 0 | 1 | 0 | row 3 |

For clarity the check words are shown in boxes.

Now, suppose that during manufacturing test row 2 is found to be faulty. Its address is programmed in the switches 103 such that the spare memory row 109 of RAM is substituted therefor. During initialization, the parity word is computed for each column of words:

| | | | | | | | | |
|---|---|---|---|---|---|---|---|---|
| 0 | 1 | 0 | 0 | 0 | 1 | 1 | 0 | row 0 |
| 1 | 1 | 1 | 1 | 1 | 0 | 0 | 0 | row 1 |
| 0 | 0 | 0 | 0 | 0 | 0 | 0 | 0 | spare row |
| 0 | 0 | 0 | 1 | 0 | 0 | 1 | 0 | row 3 |
| 1 | 0 | 1 | 0 | 1 | 1 | 0 | 0 | parity words |

These parity words are then written into the spare row:

| | | | | | | | | |
|---|---|---|---|---|---|---|---|---|
| 0 | 1 | 0 | 0 | 0 | 1 | 1 | 0 | row 0 |
| 1 | 1 | 1 | 1 | 1 | 0 | 0 | 0 | row 1 |
| 1 | 0 | 1 | 0 | 1 | 1 | 0 | 0 | spare row |

| | | | | | | | | |
|---|---|---|---|---|---|---|---|---|
| 0 | 0 | 0 | 1 | 0 | 0 | 1 | 0 | row 3 | and it will be seen that the ROM array now includes the required data.

It will be appreciated that in both the circuits described above, when the address of the defective row appears on the address lines, both the defective row of ROM and the spare memory row are accessed. However, the circuit ensures that it is only the data in the spare memory row which is output to the output data line.

Of course, if preferred, the AND gate could be arranged to disable the decoder/driver such that access to the defective row of ROM is prevented and access to the spare memory row is substituted.

In the embodiments illustrated in FIGS. 1 and 2 a single spare row of memory is associated with one array of ROM. However, the ROM array 100 is a 64×64 array, that is, a 4K memory and it is probable that if there are manufacturing defects these will cover more than one row. A ROM having several defective rows can be repaired by using an equal number of spare rows of memory. Thus, as illustrated in FIG. 3 a ROM could be formed of several blocks of ROM. Each such block could be independently addressed and a spare memory row and associated circuitry provided therefor.

If it is not required to provide one spare memory row for each block of ROM the number of programmable switches, as 3 and 103, could be increased such that the address of a block containing a defective row is stored as well as the address of the defective row.

In practice, the ROM would not be provided in blocks as shown in FIG. 3 but interleaved as illustrated in FIG. 4. FIG. 4 schematically illustrates a ROM array 300 having 64 rows and 64 columns. It is connected to its associated circuitry as if it were in fact formed in four separate blocks and adjacent rows are assigned to different blocks to produce the interleaved pattern shown in FIG. 4. This has the advantage that a manufacturing defect spanning two or more adjacent rows can be repaired as each defective row will be in a different block.

FIG. 5 shows schematically an arrangement which is particularly useful if both a ROM array 400 and a RAM array 500 are to be provided in the same circuit. As can be seen, the ROM array 400 is divided into a number of blocks and it is preferred that the rows of these blocks be interleaved as shown in FIG. 5. A number of spare memory rows 509 are also provided. These would generally be selected rows of the RAM array 500. These spare memory rows 509 could be used to replace defective rows in the ROM array if required. If one or more of these spare rows 509 were not required to repair the ROM array 400, they would be available as redundancy for the RAM array. If both the memory arrays 400 and 500 are fabricated on the same chip this simple arrangement enables a variety of different manufacturing defects to be overcome.

We claim:

1. A read only memory (ROM) comprising:
a ROM array arranged in rows and columns;
a set of memory locations for storing a respective check bit for each column;
a set of check bits stored in said set of memory locations, said check bits being derived from the data intended to be stored in said ROM;
a means for accessing selected rows in said ROM array in response to row addresses; and
apparatus for repairing the ROM array by replacing a row which has been found to have one or more defects, said repairing apparatus comprising means for storing the address of the defective row, a spare row of programmable memory for storing the data bits intended to have been stored in the defective row, means causing said spare row to be accessed whenever said defective row is addressed whereby said defective row is replaced by said spare row, and means for generating data to be stored in the spare row from the data and check bits stored in the ROM array, except in the defective row.

2. A memory circuit as claimed in claim 1, wherein each check bit is dependent upon the number of logical "zeros" or "ones" in the respective column of the ROM array.

3. A memory circuit as claimed in claim 1, wherein said apparatus further comprises writing means arranged when enabled to write data into said spare memory.

4. A memory circuit as claimed in claim 1, further comprising means for feeding the data in an accessed row of the ROM array to an output, said apparatus including means causing the data in said spare memory row to be fed to said output whenever said defective row is addressed.

5. A memory circuit as claimed in claim 1, wherein said apparatus further comprises means for comparing the incoming row address with the stored address of the defective row and for generating a spare select signal whenever said incoming new address and said stored address coincide.

6. A memory circuit as claimed in claim 5, wherein said means for accessing selected rows in the ROM array includes a row decoder/driver connected to access the selected rows and connected to a plurality of comparators, one input of each comparator being connected to a respective address line, and further comprising a plurality of programmable switches for storing the address of the defective row, one programmable switch being associated with each address line and being connected to the second input of the respective comparator, and an AND gate connected to the output of each comparator to provide the spare select signal when both inputs to each comparator coincide.

7. A memory circuit as claimed in claim 6, wherein said spare select signal is arranged to disable said row decoder/driver and to enable access to said spare row.

8. A memory circuit as claimed in claim 6, further comprising first sensing means for sensing the data in an accessed row of the ROM array, second sensing means for sening the data in said spare row, a data output, and selecting means arranged to selectively feed the sensed data to the output, wherein said spare select signal is arranged to cause said selecting means to feed the data sensed by said second sensing means to said output.

9. A memory circuit as claimed in claim 6, 7 or 8, wherein said AND gate is also connected to the output of a further programmable switch arranged to indicate whether the ROM array includes a defective row.

10. A memory circuit as claimed in claim 6 or 7, wherein said programmable switches are fuses.

11. A memory circuit as claimed in claim 1, wherein said spare select signal is arranged to disable said means for accessing individual rows and to enable access to said spare row.

12. A memory circuit as claimed in claim 1, further comprising means for feeding the data in an accessed row of the ROM array to an output, said apparatus including means causing the data in said spare memory row to be fed to said output whenever said defective row is addressed, wherein said spare select signal is arranged to disable said means for feeding the data in an accessed row to the output, and to enable said means for causing the data in said spare memory row to be fed to said output.

13. A memory circuit as claimed in claim 1, wherein said apparatus for repairing the ROM array includes a plurality of spare rows of programmable memory such that a number of defective rows of the ROM array are replaceable by spare rows, a selected spare row being accessed whenever each defective row is addressed.

14. A memory circuit as claimed in claim 13, wherein said ROM array includes a number of blocks of ROM and each of said spare rows is associated with one of said blocks such that one defective row in each block is replaceable by the associated spare row, the associated spare row being accessed whenever the defective row in that block is addressed.

15. A memory circuit as claimed in claim 13 or 14, wherein said ROM array includes a number of blocks of ROM, and the rows of each block are interleaved with the rows of the other blocks.

16. A memory circuit as claimed in claim 1, wherein the spare row of programmable memory is a row of RAM.

17. A memory circuit as claimed in claim 16, further comprising means for feeding the data in an accessed row of the ROM array to an output, said apparatus including means causing the data in said spare memory row to be fed to said output whenever said defective row is addressed.

18. A memory circuit comprising a Read Only Memory (ROM) having a plurality of memory locations, which contain data bits, arranged in rows and columns to define a ROM array, wherein the data bit in one selected memory location in each column is a check bit which has been derived from the intended contents of the respective column, the memory circuit further comprising means for accessing selected rows in the ROM array in response to the receipt of the address of each selected row, and apparatus for repairing the ROM array by replacing a row which has been found to have one or more defects, said repairing apparatus comprising means for storing the address of the defective row, a spare row of programmable memory for storing the data bits intended to have been stored in the defective row, means for comparing the incoming row address with the stored address of the defective row and for generating a spare select signal whenever said incoming new address and said stored address coincide, said spare select signal being arranged to disable said means for accessing selected rows and to enable access to said spare row whereby said defective row is replaced by said spare row, wherein said apparatus further comprises writing means arranged when enabled to write data into said spare memory row, the data written into the spare row having been generated from the data and check bits actually contained in the whole of the ROM array except for the defective row.

19. A method of repairing a Read Only Memory (ROM) having a plurality of memory locations which contain data bits, arranged in rows and columns to define a ROM array, the method comprising the steps of:
storing in the ROM a set of check bits derived from the data intended to be stored in said ROM, each column having a corresponding check bit;
testing the ROM to identify a defective row therein;
storing the address of a defective row;
generating data from data and check bits stored in the ROM array, excluding said defective row, and storing the generated data in a spare row of programmable memory, said generation step being such that the generated data corresponds to the data intended to have been stored in the defective row; and
accessing said spare row whenever said defective row is addressed such that said defective row is replaced by said spare row.

20. A method as claimed in claim 19, wherein the generated data is written into said spare row by the steps of sequentially addressing each row of the ROM array, and enabling writing means such that when said defective row is addressed, said spare row is accessed and said writing means writes said generated data into said spare row.

21. A method as claimed in claim 20, wherein each check bit is dependent upon the number of logical "zeros" or "ones" in the respective column, and wherein the data to be stored in the spare row is generated by writing a known value in each bit of the spare row, and computing a further check bit for each column dependent upon the number of logical "zeros" or "ones" in the respective column of the ROM array excluding the defective row and of the spare memory row.

22. A method as claimed in claim 21, wherein the computed further check bits are written into the respective bits of the spare memory row.

23. A method as claimed in claim 19, wherein each incoming row address is compared with the stored address of the defective row, and wherein a spare select signal is generated whenever said incoming address and said stored address coincide, said spare select signal enabling access to said spare memory row and disabling access to said defective row such that said defective row is replaced by said spare row.

24. A method as claimed in claim 23, wherein said spare select signal enables output of the data in said spare row and disables output of the data in said defective row.

25. The method of claim 19 including the step of restoring data upon initialization, comprising:
writing predetermined logic values into said spare row; then
generating a parity word based on the logic values stored in the ROM array, including a check word formed of said check bits; and
storing said parity word in said spare row for use when said defective row is addressed.

* * * * *